United States Patent
Zahringer et al.

(10) Patent No.: US 6,621,674 B1
(45) Date of Patent: Sep. 16, 2003

(54) ELECTRIC SUPPLY UNIT FOR PLASMA INSTALLATIONS

(75) Inventors: Gerhard Zahringer, Freiburg (DE); Peter Wiedfmuth, Herbolzheim (DE); Thomas Rettich, Freiburg (DE)

(73) Assignee: Hüttinger Elektronik GmbH & Co. KG, Freiburg (DE)

( * ) Notice: Subject to any disclaimer, the term of this patent is extended or adjusted under 35 U.S.C. 154(b) by 314 days.

(21) Appl. No.: 09/807,303
(22) PCT Filed: Aug. 13, 2000
(86) PCT No.: PCT/DE00/02741
§ 371 (c)(1),
(2), (4) Date: Apr. 10, 2001
(87) PCT Pub. No.: WO01/13402
PCT Pub. Date: Feb. 22, 2001

(30) Foreign Application Priority Data

Aug. 13, 1999 (DE) .......................... 199 37 859

(51) Int. Cl.[7] .............. H02M 9/00; H02M 7/00
(52) U.S. Cl. .............. 361/58; 361/18; 361/90
(58) Field of Search .............. 361/58, 29, 56, 361/90, 91, 110, 111, 118, 119, 18; 363/24, 25, 26, 132, 127

(56) References Cited

U.S. PATENT DOCUMENTS

| | | |
|---|---|---|
| 5,303,139 A | 4/1994 | Mark |
| 5,347,571 A * | 9/1994 | Furbee et al. .............. 378/105 |
| 5,682,067 A | 10/1997 | Manley et al. |
| 5,889,391 A | 3/1999 | Coleman |
| 6,195,273 B1 * | 2/2001 | Shteynberg .................. 363/26 |

FOREIGN PATENT DOCUMENTS

| | | |
|---|---|---|
| EP | 0 592 164 A1 | 4/1994 |
| EP | 1 013 792 A1 | 6/2000 |
| WO | WO 97/49267 | 12/1997 |

* cited by examiner

Primary Examiner—Rajnikant B. Patel

(57) ABSTRACT

What is described here is a power supply unit for plasma systems such as plasma processing or coating devices, wherein electric arcs or disruptive breakdown may occur, which originate from an electrode in particular, comprising

- a d.c. voltage or direct-current source whose output terminals are connected via an inductive resistor and a power switch to the electrodes of the plasma system, and possibly
- a circuit for detecting electric arcs or disruptive breakdown, that operates the switch upon occurrence of an electric arc or disruptive breakdown, in such a way that electrical energy producing a plasma will no longer be applied to the electrodes.

The invention is characterised by the provisions that the inductive resistor(s) is (are) each connected to a recovery diode and that the switch is a series switch.

In another embodiment of the invention a controller or closed-loop controller, respectively, is provided which, upon occurrence of an electric arc or disruptive breakdown, respectively, extinguishes same by disconnecting the voltage applied to the electrodes or by commutation to an inverted voltage for a defined period of time (deactivation interval), and which, upon occurrence of at least one electric arc or disruptive breakdown event, reduces the activation interval of the voltage causing plasma operation.

32 Claims, 4 Drawing Sheets

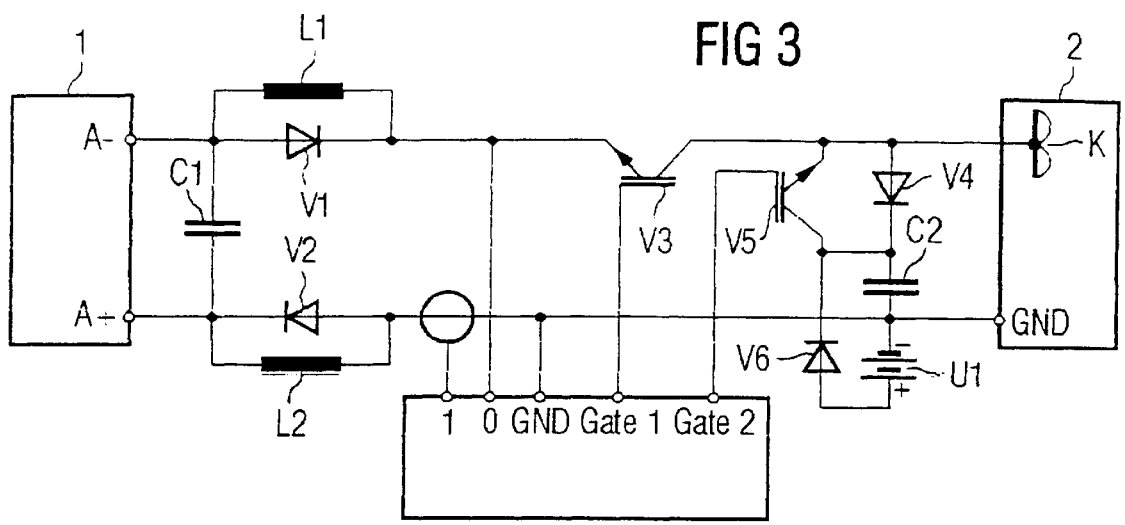
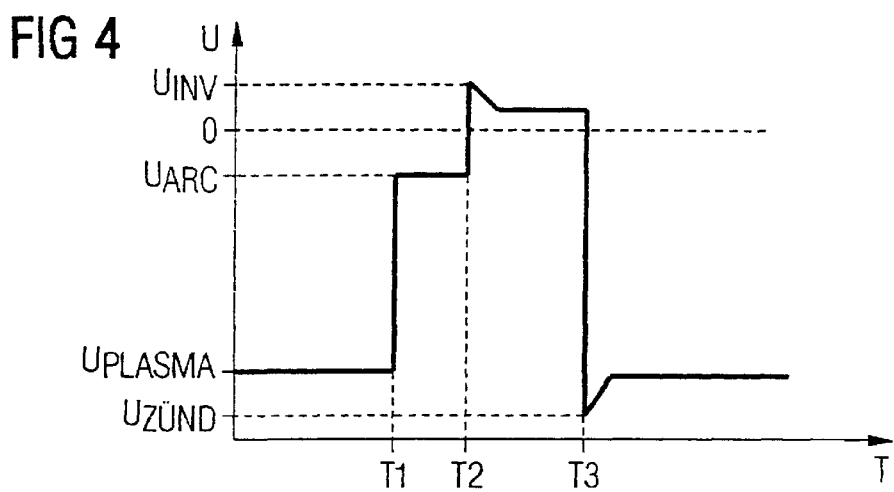
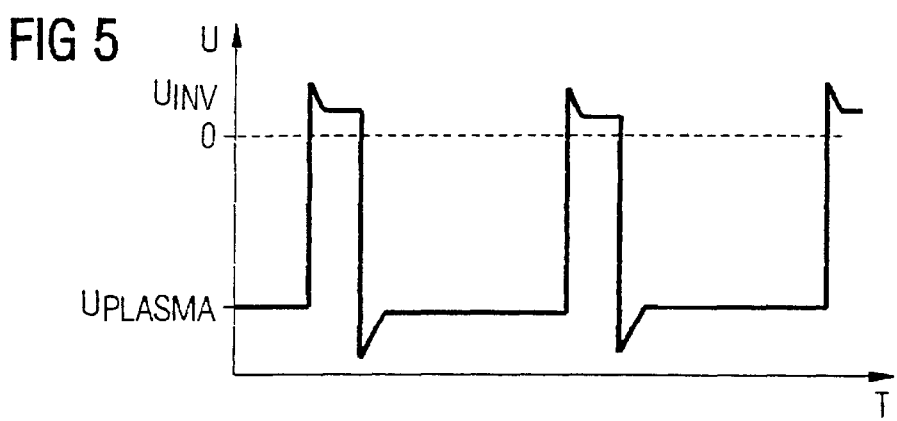

ELECTRIC SUPPLY UNIT FOR PLASMA INSTALLATIONS

FIELD OF THE INVENTION

The present invention relates to an electric power supply unit for plasma systems such as plasma-processing or coating devices wherein electric arcs or arcing may occur, particularly between the electrodes, in accordance with the introductory clauses of the independent Patent Claims.

Plasma systems for which the electric power supply units of the claimed general type are intended are suitable for a great number of potential applications and are employed, for instance, for target sputtering. As a rule, they produce an electrical power ranging from roughly a few kW up to more than 100 kW. In typical cases, the operating voltages applied to the electrodes is in the range of 400 VV. Variations in the upward or downward direction—also as a function of the respective application—are, of course, possible.

Specifically in so-called "reactive" sputtering, a technique applied, for instance, for the production of oxide or nitride films, or in the application of reactive gases problems occur as a result of disruptive breakdown and/or the formation of insulating layers on the conducting target, with the consequence that parasitic capacitors may be formed.

PRIOR ART

The most different passive and active circuits have become known which serve to extinguish electric arcs that have been formed as a result of disruptive breakdown. All of these circuits share the common feature that the voltage applied to the electrode for a defined period is disconnected. Reference is made here to the U.S. Pat. Nos. 4,692,230, 5,009,764, 5,015,493 and 5,682,067 just as examples, which are, by the way, also explicitly referred to for an explanation of all particulars and potential applications not described here in more details.

The U.S. Pat. No. 5,682,067 discloses, by the way, that state of prior art that the wording of the introductory clauses of the independent Patent Claims started out from.

The disadvantage of the circuits known from these prior art documents is the fact that after re-activation of the operating voltage the system requires a comparatively long time until it is capable again "to sputter with full power" or to process the target in any other manner.

Analogous findings apply when the system is operated in a so-called asymmetric pulsed operation for preventing insulating layers from forming on the target.

It is moreover known to disconnect the voltage applied to the electrodes—independently of whether disruptive breakdown or arcing occurs—periodically for a short interval. In such an approach the duty cycle must be so selected that during the period in which the voltage is applied disruptive breakdown or an electric arc will not occur. Even though this provision is suitable to prevent the occurrence of disruptive breakdown or electric arcs the periodic disconnection and subsequent re-application of the voltage reduces, however, the efficiency of the system substantially.

BRIEF DESCRIPTION OF THE INVENTION

The present invention is based on the problem of providing an electric supply unit for plasma systems, wherein, after re-application of the operating voltage to the electrodes, the system reaches its full power as quickly as possible, and/or wherein the reduction of efficiency is as low as possible, which is due to the occurrence of electric arcs or disruptive breakdown, e.g. as a result of the "prophylactic" disconnection of the operating voltage.

Inventive solutions to this problem are defined in the Patent claims 1 or 18, respectively. Improvements of the invention are the subject matters of the dependent Claims.

In accordance with the invention the application starts out from an electric power supply unit comprising a source of d.c. voltage or direct current, respectively, whose output terminals are connected via at least one inductive resistor and a power switch to the electrodes of the plasma system, and possibly a circuit for detecting electric arcs or disruptive breakdown, which, upon occurrence of an electric arc or disruptive breakdown, operates the switch in such a way that electric energy is no longer applied to the electrodes.

Starting out from such a known supply unit, the invention consists in the aspects that the inductive resistor(s) is (are) connected to a respective recovery diode and that the switch is a series switch.

Based on this configuration, the inventive supply unit operates as follows:

The switch, that switches the electric power applied to the electrodes (hereinafter also referred to as power switch), enables the current conduction between the d.c. voltage source and the electrodes upon detection of an electric arc. As soon as the power switch is opened the diodes, which are connected in the disabling direction relative to the normal operating voltage, prevent an increase of the voltages at the inductive resistors, producing the simultaneous effect that the current in the inductive resistors will decrease only very slowly. When the power switch is energised again after a short period already—roughly a few milliseconds are typical—the current stored in the inductive resistors is available immediately so that the system reaches its full performance more rapidly than this is the case in prior art. The inventive power supply unit hence presents a power source characteristic when the power switch is switched on again.

Hence the power losses, which occur in the inventive electric supply unit as a result of the disconnection of the operating voltage for extinction of electric arcs, are substantially smaller than those in prior art.

This inventive basic circuit—as defined in claim 1—may be extended in consideration of various aspects which may also be combined with each other:

It is possible in particular to provide an inductive resistor with an associated recovery diode in each line connecting a terminal of the d.c. voltage or direct-current source, respectively, with the respectively associated electrode. As a result, a particularly symmetrical circuit structure is achieved. It is also possible, however, to use only one inductive resistor; in such a case only one recovery diode is required.

The most different power switches can, of course, be used as switches. In view of the high performance, however, the switch is preferably an IGBT element.

Moreover, the most different power supply units may be used as mains supply circuits; equally in view of the high performance it is preferred, however, that the d.c. voltage source is a switching-controller supply unit.

In such a case it is expedient to connect a capacitor between the terminals of the d.c. voltage or direct-current source. This capacitor serves to avoid voltage peaks possibly occurring as a result of the inductive resistors in the feeders in the supply unit. Moreover, this capacitor is charged to the full no-load voltage level in the period in which the power switch is de-energised so that when the power switch is switched through the full voltages are available for exciting the plasma.

The inventive supply unit can be employed for the most different plasma systems such as plasma installations where the first electrode comprises at least one cathode disposed in a plasma chamber while the other electrode is the housing of the plasma chamber. The inventive supply unit presents furthermore the special advantage that it is also suitable for use with plasma systems wherein at least two cathodes are provided separately from each other, whereof each is connected via a series switch to an inductive resistor on the first terminal of the d.c. voltage source, that presents a recovery diode.

In such systems an alternating change-over is possible, for instance, between the cathodes. This provision entails the advantage that electric arcs being "in the incipient phase" will be reliably extinguished in the comparatively long period during which the change-over to the other cathode is performed. It is, of course, also possible, however, to perform sputtering from several cathodes.

In an improvement of the invention a diodes is connected between the electrode terminals or the pairs of electrodes, respectively. The function of this diode will be explained in the following:

As soon as the power switch is opened the voltage on the inductive feeder resistors commutates to the plasma chamber so that voltage peaks would occur without any further circuitry provisions. The diode connected between the electrode terminals shorts this voltage so that the energy stored in the inductive feeder resistors will be reduced.

It is furthermore possible to connect an LC circuit in parallel with the diode, which, as a passive element, supports the extinction of the electric arc.

It is particularly preferable, however, to support the extinction of the electric arc by active circuit elements:

To this end a capacitor may be connected in series with the diode. Then another series switch is connected between the cathode terminal and the diode/capacitor connection point. With this circuitry layout the energy that derives from the line inductance and the current conduction is re-charged as voltage into the capacitor when the power switch is opened. After a short delay, this voltage is applied via the further series switch to the electrodes so that the electric arc will be extinguished substantially more rapidly than this would be the case in a passive circuit.

To achieve an inverted voltage of appropriate magnitude for extinction even with small line inductance levels or small currents it is furthermore possible to provide an inverted-voltage source.

This inverted-voltage source may be an (auxiliary) d.c. voltage source whose negative terminal is connected to the anode and whose positive terminal is connected to the first terminal of the further series switch via a diode connected in the forward direction.

In any case it is preferable that the circuit for electric arc detection controls not only the power switch but also the additional switch.

The circuit for electric arc detection is capable of evaluating at least one of the following criteria:

voltage collapse, maximum voltage limit is exceeded, voltage drops below the minimum voltage limit, rapid current increase, maximum current limit is exceeded.

Moreover, a controller may be provided in a manner known per se, which may be a constituent of the circuit for detecting electric arcs in particular and which, for "prophylaxis", disconnects—and preferably commutes— the voltage applied to the electrodes with a fixed period. When the voltage applied to the electrodes is regularly commuted for a brief interval the occurrence of electric arcs can be substantially reduced or can electric arcs be extinguished as early as in their incipient phase.

Due to the inventive configuration, that results in rapid achievement of the power after re-connection, the regular commutation of the voltage leads only to a very slight reduction of the sputtering performed, provided that the interval during which the voltage applied to the electrodes is commuted is substantially shorter than the interval during which plasma operation is performed. Moreover, the period during which the voltage is commuted must, of course, also be so short that the current will be stored in the "inductive resistor/recovery diode" circuit.

The frequency at which the controller disconnects or commutates the voltage applied to the electrodes may be as high as up to 100 kHz.

Instead of periodic prophylactic commutation with an invariable period that is independent of the process parameters and the frequency of electric arcs or disruptive breakdown as a function of the latter, it is preferable, however, that the controller, in the manner of an adaptive controller, sets the voltage connection period in such a way that an electric arc or disruptive breakdown does "just" not occur. In this further solution to the problem underlying the present invention, which may also be employed in addition to the solution according to Claim 1, it is expedient to provide a controller or closed-loop controller that in response to the occurrence of an electric arc or disruptive breakdown extinguishes this arc by disconnecting the voltage applied to the electrodes or by change-over to an inverted voltage for a defined period (deactivation interval), and that the controller or closed-loop controller, respectively, reduces the activation interval of the voltage causing the plasma operation upon occurrence of at least one electric arc or disruptive breakdown.

In this configuration the special advantage is entailed that when the controller or closed-loop controller reduces the activation interval to a period shorter than the actual interval between two electric arcs or events of disruptive breakdown occurring in succession. As the operating parameters of a system may vary during a processing operation it is furthermore preferred that the controller or closed-loop controller also prolongs the activation interval:

To this end it is possible, for instance, that the controller or closed-loop controller prolongs the activation interval when an electric arc or disruptive breakdown did not occur or only a defined number of electric arcs or events of disruptive breakdown has occurred over a defined period or over a defined number of activation intervals. The controller and closed-loop controller may then prolong the activation interval up to continuous operation.

In an approach to avoid excessive weighting of the random occurrence of arcs in adaptive control, it is moreover preferable that the controller or closed-loop controller, respectively, shortens the activation interval only when during a defined period a certain number of electric arcs or events of disruptive breakdown has occurred.

It is moreover preferable that the controller or closed-loop controller, respectively, connects the voltage, that is applied to the electrodes at the outset of the plasma operation, either permanently or for a defined activation interval (that can be predetermined prior to the commencement of the process), then disconnects or preferably commutates it for a defined deactivation interval, and then connects the voltage again, and reduces the activation interval of the voltage upon occurrence of electric arcs or disruptive breakdown.

In order to be able to match the inventive supply unit to the most different processing or coating processes it is moreover expedient that the initial values of the activation interval and the deactivation interval and/or the number of electric arcs or disruptive breakdown events as well as the unit of time during which this number occurs can be adjusted.

It is moreover expedient in any case that the activation interval is linked up with the frequency of occurring electric arcs or disruptive breakdown via a variable characteristic that may be dependent on further process parameters.

To keep the reduction of the power of the plasma system as low as possible it is furthermore advantageous that the controller or closed-loop controller, respectively, optimises the disconnection or commutation interval, respectively. The disconnection or commutation interval is set to be "just" so long that the electric arc or disruptive breakdown will be extinguished "with a lasting effect".

BRIEF DESCRIPTION OF THE DRAWING

The invention will be described in more details in the following, with reference to the drawing wherein:

FIG. 3 shows the circuit of a second embodiment of the invention;

FIG. 4 is a voltage/time diagram for explanation of the mode of operation of the circuit shown in FIG. 3;

FIG. 5 is a voltage/time diagram for explanation of the mode of operation of a modification of the circuit shown in FIG. 3;

DESCRIPTION OF EMBODIMENTS

Figure 1:
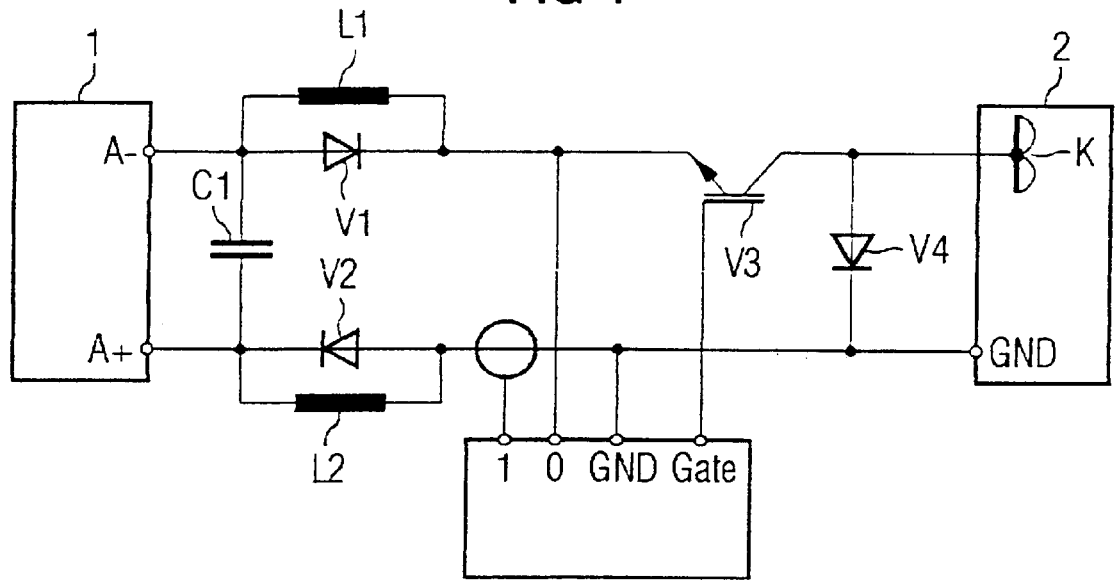
FIG. 1 shows the circuit of a first embodiment of the invention.

FIG. 1 illustrates a first embodiment of the invention. The power supply unit comprises a switching-controller supply unit 1 that furnishes, for instance (i.e. without restriction of the general applicability) a d.c. voltage of roughly 400 V. The negative output terminal A– of the supply unit 1 is connected via an inductive resistor L1 and a power switch V3 configured as series switch to a cathode K in a plasma chamber 2 having a grounded housing. In the illustrated embodiment the series switch 1 is an IGBT element. The positive output terminal A+ of the power supply unit 1 is connected via an inductive resistor L2 to the housing of the plasma chamber 2. This is symbolically indicated by GND.

In accordance with the invention, diodes V1 or V2, respectively, are connected in parallel with the inductive resistors L1 and L2, which are polarised in such a form that they are inhibiting during plasma operation.

Moreover, a capacitor C1 is connected between the output terminals A– and A+. A diode V4 is connected between the cathode terminal and GND, which is commuted in the inhibiting direction during plasma operation.

Moreover, a circuit is provided for detecting electric arcs or disruptive breakdown and for controlling the series switch V3 via the "gate" output terminal. For detection of an electric arc—also simply referred to as arc—the circuit measures the current flow I and the voltage U and analyses the parameters so measured in consideration of the following criteria:

voltage collapse,
maximum voltage limit is exceeded,
voltage drops below the minimum voltage limit,
rapid current increase,
maximum current limit is exceeded.

When an electric arc has been detected the power switch V3 is opened by the circuit 3 so as to interrupt the current conduction between the power supply unit 1 and the electrodes of the plasma chamber 2. When the power switch is opened the voltage at the inductive feeder resistors is commuted to the plasma chamber 2; in order to avoid that this operation results in voltage peaks the electrodes are shorted via the diode V4 while the energy is reduced that is stored in the inductive feeder electrodes. The diodes V1 and V2 prevent, on the one hand, the voltages on the inductive resistors L1 and L2 from increasing when the power switch is opened, and produce the simultaneous effect that the current in the inductive resistors will decrease only very slowly. The inductive resistors L1 and L2 may also be magnetically coupled. The capacitor C1 serves to avoid voltage peaks that may occur on account of the inductive feeder resistors.

Figure 2:
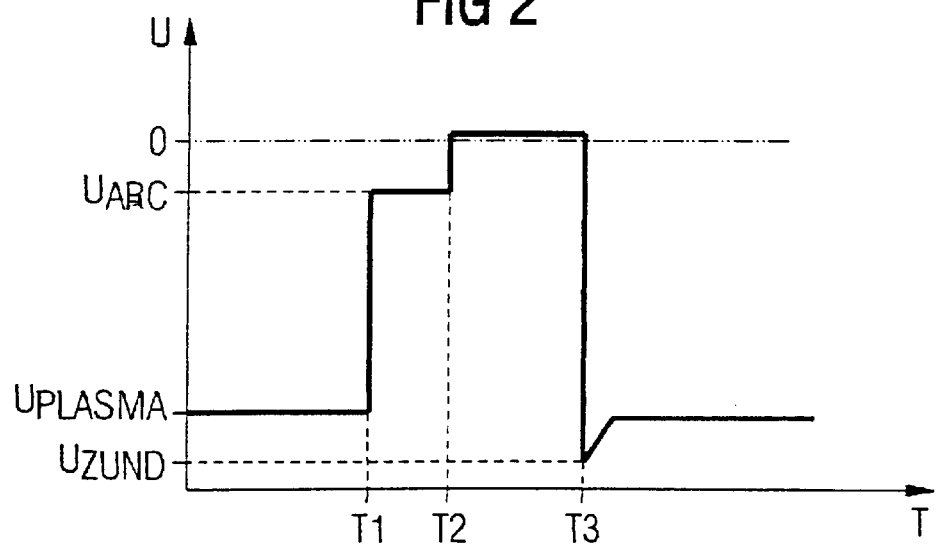
FIG. 2 is a voltage/time diagram for explanation of the mode of operation of the circuit shown in FIG. 1.

The mode of operation of the electric power supply unit according to FIG. 1 will be explained in more details in the following, with reference to FIG. 2 illustrating a voltage/time diagram:

The voltage U collapses as a result of an electric arc to the voltage UARC typical of an electric arc or disruptive breakdown by the time T1. After the adjustable delay interval T1-T2 the switch V3 is opened while the energy supply is interrupted. After the adjustable arc pause T2-T3 the switch V3 is closed again, whereupon the voltage rises to the excitation voltage UZünd and then collapses again to the burning voltage UPlasma.

Due to the recovery diodes V1 and V2 provided in correspondence with the invention, the generator output current by the time of disconnection is stored so that the initial operating condition is reached again very rapidly upon re-connection.

FIG. 3 shows a modification of the embodiment illustrated in FIG. 1. There parts equal to those of FIG. 1 are identified by the same reference numerals so that a repeated discussion will be omitted here.

In this embodiment a capacitor C2 is connected in series with the diode V4. A further series switch V5 is connected between the terminal of the cathode K and the diode V4/capacitor C2 connexion point, that is equally controlled via the Gate2 output terminal by the circuit 3.

Moreover, an inverted-voltage source may be optionally provided which comprises an (auxiliary) d.c. voltage source U1 that furnishes a voltage of roughly 30 V in typical cases. The negative terminal of the d.c. voltage source U1 is connected to the anode whilst the positive terminal of the d.c. voltage source U1 is connected via a diode V6, that is connected in the forward direction, to a terminal of the further series switch V5.

The mode of operation of the second embodiment according to FIG. 3 will be explained in more details in the following with reference to FIG. 4 illustrating a voltage/time diagram.

Upon occurrence of an electric arc (time T1) the voltage collapses from the plasma voltage UPlasma to the voltage UArc of the electric arc. In response, the circuit 3 opens the power switch V3. By means of the capacitor C2 connected in series with the diode V4, the energy resulting from the line inductance and the current is re-charged as voltage into the capacitor C2. By the time T2 this voltage is applied as inverted voltage to the electrodes of the plasma chamber 2 so that the electric arc is extinguished substantially more rapidly than in the case without active extinction. Due to the optional voltage source U1 the applied inverted voltage can be increased.

When the circuit 3 is provided with an additional pulse generator it is possible to commute the voltage applied to the plasma chamber not only upon occurrence of an electric arc but also regularly for a short moment. With this provision the probability of occurrence of electric arcs can be substantially reduced or electric arc can be extinguished again as early as in their incipient phase.

In addition the formation of oxide layers on the target during reactive sputtering is prevented; moreover oxidised targets can be sputtered for oxide removal.

FIG. 5 is a schematic illustration of the development of the voltage for this modification of the embodiment shown in FIG. 3. Depending on the respectively employed power switch, the pulse frequencies may be as high as up to 100 kHz.

Figure 6:
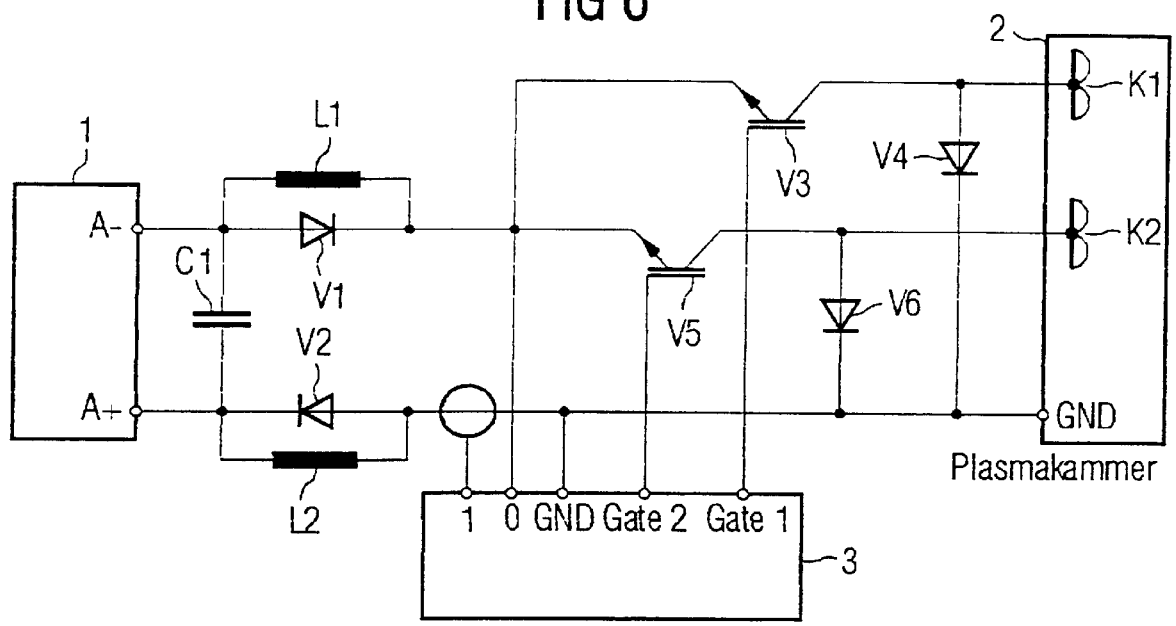
FIG. 6 illustrates the circuit of a third embodiment of the invention.

FIG. 6 shows the circuit of a third embodiment of the invention wherein two cathodes K1 and K2 are disposed in the plasma chamber 2, which are each associated with a separate power switch V3 or V5 and a diode V4 or V6.

When the power switches V3 and V5 are turned on simultaneously the two cathodes are operating in parallel. When the two switches are turned on in alternation it is possible to control the effective performance of the cathodes by varying the connexion intervals. Commutation frequencies up to several kHz are possible.

Figure 7:
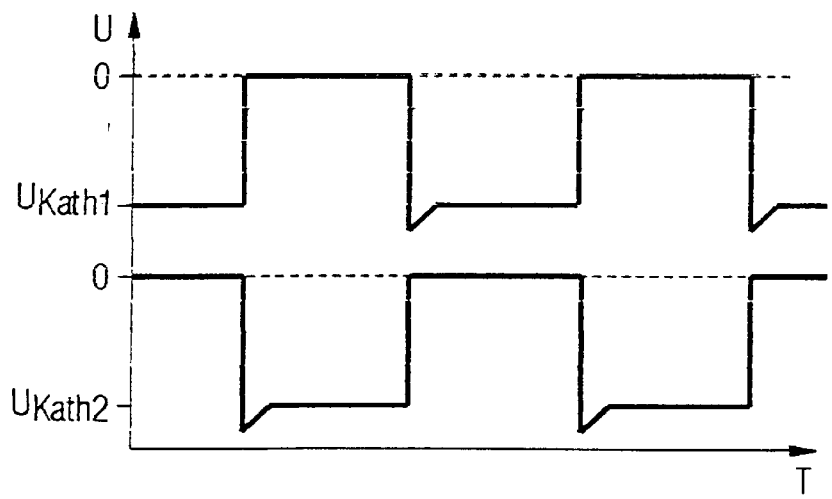
FIG. 7 is a voltage/time diagram for explanation of the mode of operation of the third embodiment.

FIG. 7 illustrates a voltage/time diagram wherein the alternating connexion of the two switches is schematically illustrated. It is, of course, also possible to use more than two cathodes.

Figure 8:
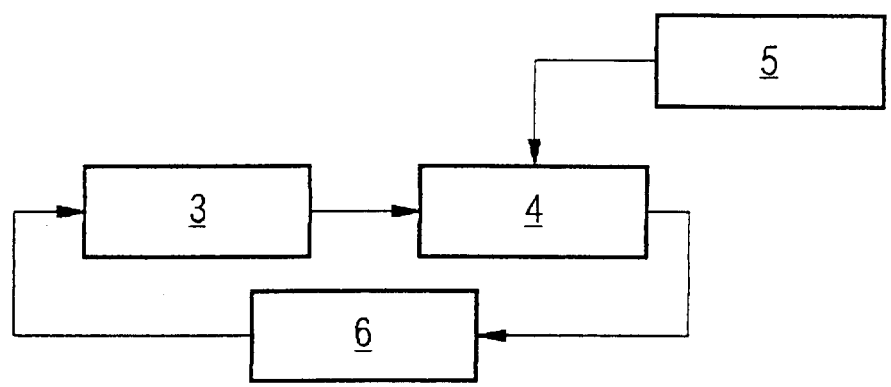
FIG. 8 is a block diagram of a fourth embodiment.

FIG. 8 shows a fourth embodiment of the invention wherein the power reduction that occurs in the approach according to FIG. 5 due to the prophylactic commutation of the voltage with an invariably predetermined frequency is distinctly reduced:

In this embodiment, the circuit 3 is completed with an adaptive controller 4 including a unit 5 for determining an initial value.

Due to the employment of an adaptive controller 4 the connexion interval of the voltage applied to the electrodes is not invariably predetermined. In operation the adaptive controller 4 sets a highest possible connexion interval in order to avoid an interruption of the plasma process in a plasma system 6 by unnecessary duty cycles—as is illustrated in FIGS. 5 and 7. When, however, electric arcs do occur the connexion interval is shortened upon extinction of the arc. This reduces the probability of occurrence of a repeated arc. When despite the shorter connexion interval an electric arc keeps occurring the connexion period is further shortened until a stable arc-free operation becomes possible. The connexion interval is correspondingly prolonged when arcs did not occur over a defined period. The connexion interval is then prolonged until electric arcs occur again in the process. The prolongation of the connexion interval may be continued up to a point where the system runs in "continuous operation" (CW operation).

Figure 9:
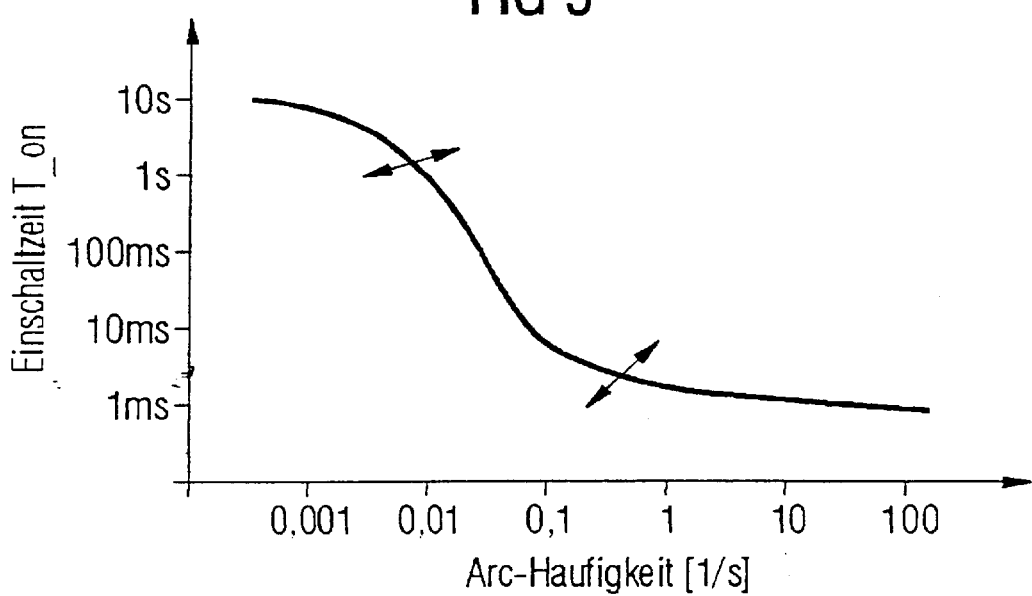
FIG. 9 is an illustration for explanation of the mode of operation of the fourth embodiment.

The connexion interval and the frequency of arcs may be linked up or correlated via a variable characteristic of the adaptive controller, that may be dependent on further process parameters—such as process gases, target materials and sputter materials, etc. FIG. 9 shows a qualitative characteristic wherein the arc frequency plotted on the abscissa (½) is correlated with the connexion interval (s) plotted on the ordinate. Attention is explicitly drawn to the fact that corresponding characteristics are not only dependent on several parameters but also on the geometry of the plasma system, the process materials, etc. The characteristic lines are preferably determined on a trial-and-error basis and/or adaptively adjusted by the controller 4 that may include a microprocessor, for instance.

The unit 5 for determining an initial value may be used to predetermine specific values of the connexion interval, which were found to be expedient, as well as the connexion or commutation interval by the beginning of plasma operation, or to select certain characteristics already established.

With the application of an adaptive control algorithm the parameters of arc management are matched with the process parameters in an optimum manner. It is also possible in particular to set the disconnection or commutation interval in an optimum form—possibly also in an adaptive manner.

The invention has been described in the foregoing by exemplary embodiments, without any restriction of its general character. In particular, the inventive supply unit may be used for all applications known from the prior publications identified by way of introduction. Moreover, the various properties of the embodiments may be combined with each other: it is hence possible, for instance, to combine the pulsed operation or the adaptive control, the active extinction of electric arcs and the commutation between two or more cathodes, either partly or completely, or to change over between the individual operating modes described here.

What is claimed is:

1. An electric power supply unit for plasma systems such as plasma processing or coating devices wherein electric arcs or disruptive breakdown may occur and originate from an electrode, comprising:
   (a) a direct current voltage source with output terminals connected by an inductive resistor and a power switch to the electrodes of the plasma system; and
   (b) a circuit for detecting electric arcs or disruptive breakdown and, operative upon said switch upon occurrence of an electric arc or disruptive breakdown to terminate supply of electrical energy to the electrodes to produce a plasma said inductive resistor (L1, L2) being connected to a recovery diode (V1, V2) and said switch being a series switch (V3).

2. The power supply unit according to claim 1, wherein an inductive resistor (L21, L2) with an associated recovery diode (V1, V2) is provided in each line connecting a terminal of said direct current voltage source (1) to the associated electrode (cathode, GND).

3. The power supply unit according to claim 1 or claim 2, wherein said switch (V3) is an IGBT element.

4. The power supply unit according to claim 1 or claim 2, wherein said direct current voltage source is a switching controller supply unit.

5. The power supply unit according to claim 1 or claim 2, wherein a capacitor (C1) is connected between the terminals (A−, A+) of said direct current voltage source (1).

6. The power supply unit according to claim 1 or claim 2, wherein the first one of said electrodes comprises a cathode disposed in a plasma chamber, and the other electrode is a housing of said plasma chamber (GND).

7. The power supply unit according to claim 6, wherein at least two separated cathodes (cathode 1, cathode 2) are provided and each is connected by a series switch (V3, V5) to said inductive resistor (L1) connected to a recovery diode.

8. The power supply unit according to claim 7, wherein an alternating change-over is performed between said cathodes.

9. The power supply unit according to claim 1 or claim 2 wherein a diode (V4) is connected between said electrode terminals.

10. The power supply unit according to claim 9, wherein a capacitor (C2) is connected in series with said diode (V4), and wherein a farther series switch (V5) is connected between said cathode terminal and the connection point to said diode (V4) capacitor (C2).

11. The power supply unit according to claim 1 or claim 2, wherein there is included an inverted voltage source.

12. The power supply unit according to claim 10 wherein said inverted voltage source is an direct contact voltage source (U1) whose negative terminal is connected to the anode and whose positive terminal is connected by a diode (V6) connected in the forward direction to a first terminal of said further series switch (V5).

13. The power supply unit according to claim 10 said circuit (3) is also controlled by said further switch (V5), in addition to said power switch (V3), for detection of electric arcs.

14. The power supply according to claim 13, wherein said circuit for detecting disruptive breakdown or electric arcs is adapted to determine at least one or following criteria:

voltage collapse, maximum voltage limit is exceeded voltage drops below the minimum voltage limit, rapid current increases, maximum current limit is exceeded.

15. The power supply unit according to claim 1 or 2, wherein a controller is provided to disconnect the voltage applied to said electrodes.

16. The power supply unit according to claim 15, wherein the frequency a t which said controller disconnects the voltage applied to said electrodes is as high as 100 kHz.

17. The power supply unit according to claim 5 or 16, wherein the interval during which the voltage applied to said electrodes is commutated is substantially shorter than the interval during which plasma operation is performed.

18. The power supply unit according to claim 1 wherein a controller is provided which, upon occurrence of an electric arc or disruptive breakdown, extinguishes the arc or breakdown by disconnecting the voltage applied to said electrodes or by commutation to an inverted voltage for a defined period of time (deactivation interval), and upon occurrence of at least one electric arc or disruptive breakdown, said controller reducing the activation interval of the voltage causing plasma operation.

19. The power supply unit according to claim 18, wherein said controller reduces the activation interval to a period shorter than the actual time interval between two electrode arcs or disruptive breakdown events occurring in succession.

20. The power supply unit according to claim 18 wherein said controller reduces the activation interval only when a defined number of electric arcs or disruptive breakdown events has occurred during a defined period of time.

21. The power supply unit according to claim 18 wherein said controller prolongs the activation interval when an electric arc or disruptive breakdown does not occur or only a defined number of electric arcs or disruptive breakdown events occurred over a defined period of tune or over a defined number of activation intervals.

22. The power supply unit according to claim 18 wherein said controller is capable of prolonging the activation interval up to continuous (CW) operation.

23. The power supply unit according to claim 18 wherein said controller activates the voltage applied to said electrodes (cathode K, GND) at the beginning of plasma operation, either continuously or for a defined activation interval, then deactivates or preferably commutates it for a defined deactivation interval, and then activates the voltage again, and wherein said controller reduces the interval of voltage activation upon occurrence of electric arcs or disruptive breakdown, respectively.

24. The power supply unit according to claim 23, wherein the initial values of said activation interval and deactivation interval and/or the number of electric arcs or disruptive breakdown events as well as the unit of time during which this number occurs are adjustable.

25. The power supply unit according to claim 18 wherein the activation interval is linked with the frequency of occurrence of electric arcs or disruptive breakdown events, respectively, by a viable characteristic that may be dependent on further process parameters.

26. The power supply unit according to claim 15 wherein said controller optimizes the deactivation interval.

27. The power supply unit according to claim 15 wherein said controller is a constituent of said circuit (3) for detecting electric arcs.

28. The power supply unit according to claim 15 wherein a predetermining unit (5) is provided by means of which the initial values and/or characteristics are adjustable.

29. The power supply unit according claim 1 wherein there is included means to change between at least two of the operating modes—rapid deactivation only upon occurrence of arcs, periodic deactivation or commutation, respectively, and adaptive control.

30. The power supply unit according to claim 1 or 2, wherein a controller is provided to commutate periodically the voltage applied to said electrodes.

31. The power supply unit according to claim 15, wherein the frequency at which said controller commutates the voltage applied to said electrodes is as high as 100 kHz.

32. The power supply unit according to claim 18 wherein said controller is a closed loop is provided which, upon occurrence of an electric arc or disruptive breakdown, respectively, extinguishes the arc or breakdown by disconnecting the voltage applied to said electrodes or by commutation to an inverted voltage for a defined period of time (deactivation interval), and upon occurrence of at least one electric arc or disruptive breakdown, said controller reducing the activation interval of the voltage causing plasma operation.

* * * * *